United States Patent [19]

Fulton

[11] 4,275,314
[45] Jun. 23, 1981

[54] JOSEPHSON ATTO-WEBER SWITCH

[75] Inventor: Theodore A. Fulton, Warren Township, Somerset County, N.J.

[73] Assignee: Bell Telephone Laboratories, Incorporated, Murray Hill, N.J.

[21] Appl. No.: 34,569

[22] Filed: Apr. 30, 1979

[51] Int. Cl.³ .................. H03K 19/195; H03K 19/20
[52] U.S. Cl. .................................... 307/462; 307/277
[58] Field of Search ............. 307/212, 245, 277, 306, 307/214, 215, 218

[56] References Cited

U.S. PATENT DOCUMENTS

| | | | |
|---|---|---|---|
| 3,943,383 | 3/1976 | Hamel | 307/261 |
| 4,051,393 | 9/1977 | Fulton | 307/306 |
| 4,136,290 | 1/1979 | Davidson et al. | 307/212 X |

Primary Examiner—John Zazworsky
Attorney, Agent, or Firm—Michael J. Urbano

[57] ABSTRACT

A current-switched gate is described which comprises two Josephson tunnel junctions and a small resistor in a triangular loop. Directly combined bias and control currents flow through one junction in the zero-voltage state, causing the switching. The second junction and the resistor provide isolation between input and output after switching. Switching speeds of a few tens of picoseconds and the microwatt power dissipation are attained. Latching as well as nonlatching schemes and memory circuits are described.

17 Claims, 10 Drawing Figures (JAWS)

(INVERT)

(AND)

(INVERT)

(EX-OR)

(HUFFLE)

(HUFFLE)

JOSEPHSON ATTO-WEBER SWITCH

BACKGROUND OF THE INVENTION

This invention relates to current-switched Josephson junction logic and memory circuits.

Logic and memory applications of Josephson tunnel junctions have received considerable attention in recent years. Many designs employ the influence of magnetic fields upon the current-voltage (I-V) characteristics. For gates comprising single junctions or two or more junctions in parallel (interferometers), an applied magnetic field reduces $I_J$, the maximum current that the gate can carry in the V=0 state. The reduction of $I_J$ below the bias current $I_b$ causes the gate to switch from V=0 to a finite voltage, causing $I_b$ to be largely diverted to parallel resistive or inductive paths where it acts as a control or bias current for other gates.

An alternative means for inducing switching from V=0 to V≠0 is current-switching, the direct addition of part of the control current to the bias current, with switching occurring if the sum exceeds a fixed $I_J$. A design called the "goalpost" using this approach is described in my U.S. Pat. No. 4,051,393.

SUMMARY OF THE INVENTION

A current switched Josephson junction gate in accordance with my invention is a true current switched device in that it works precisely in the manner of summing control and bias currents and comparing them to a threshold. In one embodiment, the gate is a three-node circuit illustratively in the form of a triangular loop containing two Josephson junctions J1 and J2 and a resistor r. Junction J2 is connected between input node N1 and output node N2, junction J1 is connected between output node N2 and node N3 which acts as a current return, and resistor r is connected between nodes N1 and N3. Bias current $I_b$ is applied to output node N2 and input (or control) current $I_c$ is applied to input node N1. An additional bias current $I_o$ may also be applied to N1. An output (or fanout) line illustratively containing a resistance R>>r is connected to output node N2. In other embodiments, the output line acts as a transmission line of inductance L in which case L>>L', where L' is the inductance of the loop excluding the Josephson junction inductances. The current on the output line may act as a control current for other gates.

In operation as a latching logic scheme, J1 and J2 are both at V=0 initially. The direction and magnitude of the various bias currents, the value of r, and the inductance of the loop are chosen in relationship to the junction critical currents $I_J$ so that the application of a suitable control current $I_c$ causes additional current to flow through J1 and J2, which in turn causes J1 and J2 to switch to V≠0 sequentially. Illustratively, first junction J1 switches to $V_1$≠0 and becomes a high resistance path. The currents then seek the lowest resistance path to ground (i.e., node N3), which for $I_c$ and $I_o$ is through r and for $I_b$ is through J2 and then r. J2 now switches to $V_2$≠0 so that $I_b$ is largely diverted to the fanout line. Because R>>r, after the gate switches (i.e., both J1 and J2 switch to V≠0), $I_c$ and $I_o$ continue to flow through r to N3 and little disturbance is produced on the input line. That is, the input and output are isolated.

Because this gate exhibits a considerable lack of dependence on magnetic field (it switches for field within the loop of a few X $10^{-18}$ Webers of flux, or a few Atto-Webers), I have named it the Josephson-Atto-Weber Switch (JAWS).

A variety of circuits employing the JAWS gate design, including nonlatching as well as latching schemes, will be described hereinafter.

BRIEF DESCRIPTION OF THE DRAWING

My invention, together with its various features and advantages, can be readily understood from the following more detailed description taken in conjunction with the accompanying drawing.

Figure 1:
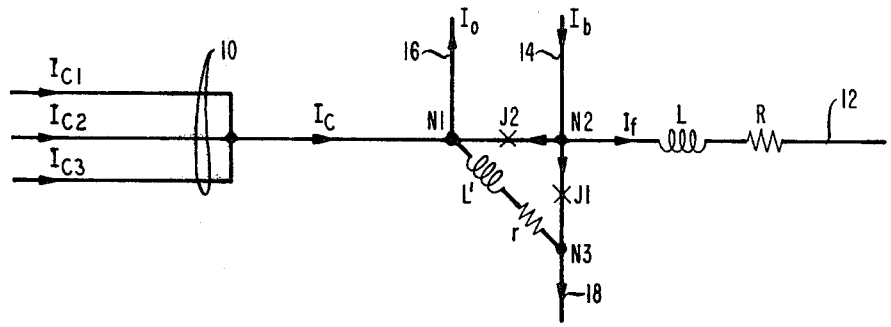
FIG. 1 is a circuit schematic of a JAWS gate in accordance with an illustrative embodiment of my invention.

In each of the figures, bias currents $I_b$ and $I_o$ are identically labeled in separate gates of the same circuit but need not have the same current levels.

DETAILED DESCRIPTION

General Considerations

Before discussing my invention in detail, several matters should be understood. First of all, each of the circuits to be described is in practice maintained within a cryogenically cooled environment well known in the art in order to reduce the temperature below the superconducting transition temperature of the superconductors used to form the circuits. Secondly, each of the circuits is in practice typically fabricated on, but insulated from, a superconducting ground plane. The thickness of the insulator between the ground plane and the circuit elements can be used, in conjunction with the thickness and length of the elements, to control the inductances of the circuit branches. Alternatively, the ground plane may be patterned with apertures to control the inductances. Third, in the drawing discrete inductors are depicted for the purpose of explanation only. These inductors actually represent the distributed self-inductance or mutual inductance of the superconductive conductors or strip lines. All such conductors have some inductance, but inductors are shown only where helpful to the discussion. No lumped-circuit inductors are actually utilized. The conductors, of course, also possess distributed capacitance and hence may be viewed as transmission lines. In cases where the transmission line characteristic impedance is large compared to circuit resistance, only the inductances of the conductors need be considered in describing circuit operation. Fourth, the drawing also depicts discrete resistors which are formed by inserting segments of normal metals or nonsuperconductors in the otherwise superconducting circuit paths.

Basic JAWS

The basic JAWS gate, as shown in FIG. 1, includes three nodes N1, N2, and N3 with a first Josephson junction J1 in the circuit branch between N2 and N3, a second Josephson junction J2 in the branch between N1 and N2 and a resistor r in the branch between N1 and N3. From a topological standpoint, these nodes and branches form a triangular loop although in practice the geometrical shape of the loop is not critical. The inductance of the loop, designated L', as shown located in series with r and does not include the inductances of the junctions.

One or more control current lines 10 are connected to input node N1, an output (or fanout) line 12 is connected to output node N2, electrode means 14 for a primary bias current supply $I_b$ is connected to the node (N2) between J1 and J2 and an optional electrode means 16 for an auxiliary bias current supply $I_o$ is connected to N1. The direction of $I_o$ may be out of the loop (i.e., out of N1) as shown or into the loop depending on the function desired. Similar comments apply to $I_b$, but the directions of $I_o$ and $I_b$ are opposite to one another in any case. Node N3 is connected to a low resistance current return path 18, illustratively ground.

Typically, the fanout current $I_f$ serves as the control current $I_c$ for other downstream JAWS, as will be exemplified in other embodiments. As will be described more fully hereinafter, the impedance of the output line should be much greater than the impedance of the path through J2 and r.

To illustrate the operation of JAWS, consider a latching logic scheme. Assume that $I_o$ is directed out of the loop and that a single control current $I_c$ is applied to input node N1 in the same direction as bias current $I_b$. The operation involves the direct merging of the control current $I_c$ with bias currents $I_o$ and $I_b$ as they flow to ground through J2 and J1. Suppose, for example, that both junctions are initially at V=0, and $I_c$ is initially zero. The current levels in J1 and J2 are $(I_b-I_o)$ and $I_o$, respectively, with the positive senses shown by the arrows in FIG. 1. If the value of $I_c$ then abruptly increases in the positive sense due, for example, to the switching of an upstream gate (not shown), $I_c$ will initially flow partly through r and partly through J1 and J2, according to the relative impedances of the two paths. The current through r will then decay with time constant L'/r (neglecting the Josephson inductances), and $I_c$ ends up flowing through J2 and then J1 to ground. The final current through J1 will be $I_b-I_o+I_c$ and that through J2 will be $I_o-I_c$. The critical current $I_{J1}$ of J1 is made to satisfy $(I_b-I_o)<I_{J1}<(I_b-I_o)+I_c$, so that J1 will switch to V≠0 forming in effect a high resistance path. The currents then seek the lowest impedance path to ground, which for $I_c$ and $I_o$ is through r and for $I_b$ is through J2 and then r. To insure that $I_b$ flows through J2 and r, the resistance of the output line should be much greater than that of the path through J2 and r; i.e., R>>r. In addition, the critical current $I_{J2}$ of J2 is made to satisfy $I_o<I_{J2}<I_b$ (neglecting residual currents through J1) so that J2 also switches to V≠0 and becomes a high resistance path. The bias current $I_b$ will then be largely diverted to the fanout line as $I_f$. The resistors in the fanout line are typically of order $R\sim 2\Delta/I_c>>r$, where $2\Delta$ is the energy gap voltage of the junctions. Consequently, after the gate switches, $I_c$ and $I_o$ continue to flow through r to ground, and little disturbance is produced on the input lines; i.e., the input and output are essentially isolated.

The foregoing description of the switching process tacitly assumes classical behavior of the loop; i.e., a loop inductance $L'>>\phi_o/I_J$ where $\phi_o$ is the flux quantum. Numerical and mechanical simulations show that the switching behavior for $L'\lesssim\phi_o/I_c$ is similar and equally effective. The requirements for $I_{J1}$ are the same in this limit, while those on $I_{J2}$ are somewhat improved in the upper bound. Note that so long as r and L' are small compared to the resistance and inductance of the fanout line, their exact values are noncritical. For best speed, the value of L'/r should be made less than the total gate delay.

In practical embodiments, the control current $I_c$ is the sum of currents from two or more gates, the sum being obtained by merging the control lines as shown in FIG. 1 where three such lines are connected to input node N1. Thus, AND, OR, and INVERT functions can be performed as described later. Note that the gate has DC response; i.e., the separate control currents need not occur simultaneously. Multiple fanout is achieved by splitting the fanout line into several paths (see gate G2 of FIG. 2).

EXAMPLES

As a numerical example of the margins, take the values $I_b=1.4$ mA, $I_o=0.9$ mA, and $I_c=0.0$ mA or 0.3 mA. These values constrain the critical currents to 0.5 mA$<I_{J1}<$0.8 mA and 0.9 mA$<I_{J2}<$1.4 mA, so that the $I_J$'s may vary independently by a factor of more than 1.5 before operational tolerances are exceeded. If a current of 0.2 mA remains flowing through the junctions after switching, then a net current of 1.2 mA is diverted to the fanout line. This provides a fanout of four. However, as discussed hereinafter, additional junctions added in parallel with additional bias currents may be employed to increase the diverted current levels if desired.

The circuit operation depends on the relative proportions rather than the absolute magnitudes of the currents. Consequently, one can operate with currents appropriate to the characteristic impedance of the lines (for best speed) or as small as desired (for low power) within thermal noise limits. The ability to be operated at low currents should permit this design to be fabricated using linewidths of less than one micron.

Logic delays are determined by the usual factors of charging time of the capacitance of the junction, propagation time on the intervening transmission lines (for matched lines, or inductive or capacitive charging times for unmatched lines) plus the time involved in transferring the current from r to the junctions. In the limit of small $L'I_J<<\phi_o$, the Josephson inductance $L_J$ of the junctions dominates, and the delay is a few $L_J/r$ times. For the values $L_J=\phi_o/2\pi I_J$, r=0.05R and R/4≈$2\Delta/I_J$ (fanout of four) one obtains $L_J/r\approx 10\phi_o/8\pi\Delta$ so that ≲5 ps would be the delay for junctions made of lead alloys. Since the gate does not present a large inductive discontinuity to the control line, positioning the fanout resistors R on the input lines near a downstream gate should provide adequate matching.

The gate is fairly compact by Josephson standards, requiring about twenty squares for J1, J2, and r to be positioned side by side and less if they are superimposed. Bias lines and fanout lines occupy the bulk of the space as usual. Offset and bias currents can be furnished on the same lines as the fanout and control currents if desired.

The phenomenon corresponding to the resonant current steps, which are troublesome in magnetic field switching, in a step arising from the L'C resonance in the triangular loop, where C is the capacitance of the two junctions in series. In many cases, the L'C resonance is damped out by the resistor r, suppressing the step. For a numerical example, take the values L'=1 pH, C=4 pF, $I_b$=400 μA, R=25 Ω (fanout of four), and r=1 Ω, giving critical damping.

A demonstration circuit containing several such gates arranged in logical series has been fabricated (in 10 μm linewidths) by the technique described by L. N. Dunkleberger in copending application Ser. No. 841,797, filed Oct. 13, 1977, and assigned to the assignee hereof (now U.S. Pat. No. 4,218,532 issued on Aug. 19, 1980). The circuit operated successfully. Fanouts of one or two were employed. Some gates employed two inputs, one from an upstream gate and the other from an external current source, allowing effective demonstration of two-input AND, OR, and timed INVERT operation. Eight gates with fanouts of unity were arranged in a chain and observed to switch in succession under a common current bias. Logic delays were anticipated and observed to be of the order of 200 psec./gate, limited by the inductance of the fanout lines (no ground plane). Operation of the same circuit with an added ground plane was also successfully carried out. The reduced inductance should have increased the speed by about a factor of five, but direct measurements showed only that the speeds were less than 120 psec. But, similar circuits with 5 μm linewidths on a ground plane have had speeds measured at about 20 psec. Use of this gate design in DC-powered flip-flops of the HUFFLE configuration, as described hereinafter, has also been successfully carried out. HUFFLE stands for hybrid unlatching flip-flop logic element and is fully described in my copending application with A. F. Hebard, Ser. No. 974,376, filed on Dec. 29, 1978, and assigned to the assignee hereof.

LATCHING LOGIC CIRCUITS

The JAWS circuit of FIG. 1 can be used to perform a two input OR or AND function. Assume illustratively that the inputs labeled $I_{c1}$ and $I_{c2}$ may carry either zero current or a positive current $\Delta I_c$ in the sense shown. Then to perform an OR function, one selects the values of the critical currents $I_{J1}$ and $I_{J2}$ and the offset current bias $I_o$ to obey the inequalities $$I_b - I_o < I_{J1} < I_b - I_o + \Delta I_c I_o < I_{J2} < I_b.$$

Alternatively, to perform the AND function, one would choose $I_{J1}$, $I_{J2}$, and $I_o$ so as to obey the inequalities $$I_b - I_o + \Delta I_c < I_{J1} < I_b - I_o + 2\Delta I_c I_o < I_{J2} < I_b.$$

OR or AND functions, with three or more inputs, may be accomplished in a similar way.

In a more general situation, where the two levels of control current on the input lines are $I_{co}$ and $(I_{co} + \Delta I_c)$ with $\Delta I_c$ positive and $I_{co}$ not necessarily zero, the above inequalities for OR and AND operation are still valid if one replaces $I_o$ by $I_o + I_{co}$. Thus, we shall assume hereinafter without loss of generality that one level of $I_c$ is zero.

Figure 2:
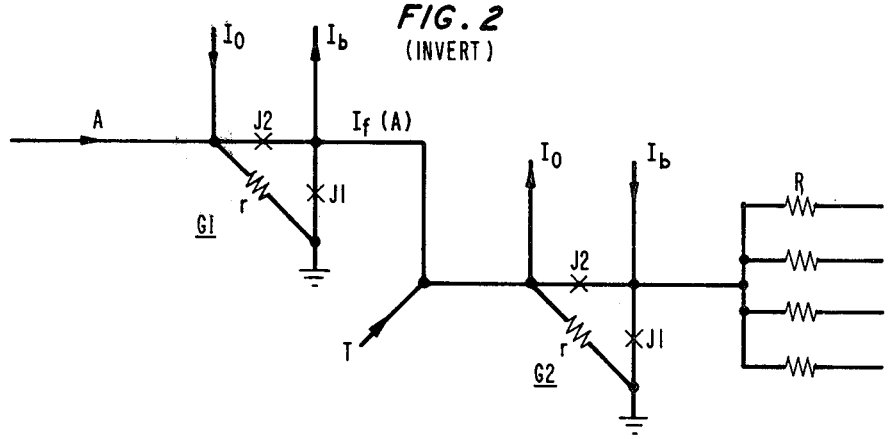
FIG. 2 is a circuit schematic of a timed INVERT circuit in accordance with another embodiment of my invention.

The JAWS circuit of FIG. 1 may be modified so that the directions of the current biases $I_o$ and $I_b$ are reversed, while the direction of the control current A remains the same, as depicted in gate G1 of FIG. 2. Note that $I_b$ and A now have opposite directions. In this case, current summation and switching takes place in J2, for which the relation $I_o < I_{J2} < I_c + I_o$ is satisfied. Once J2 switches to V≠0, its high resistance causes the current in J1 to increase to $I_b$. Since the critical current in J1 obeys $I_b - I_o < I_{J1} < I_b$, J1 switches to V≠0 diverting current to $I_f$. But, the fanout current $I_f$ and the control current A have opposite directions whereas in FIG. 1 they have the same direction. As with FIG. 1, however, G1 may have multiple inputs for performing AND and OR operations.

This feature can be employed to make an INVERT circuit as shown in FIG. 2. JAWS gate G1 is as described immediately above. Its output is connected to the input of JAWS gate G2. If an input A arrives from an upstream junction, G1 switches and produces a negative control current $I_f(A)$ in gate G2. Gate G2 is almost as described in FIG. 1, except that the critical currents obey $$I_b - I_o < I_{J1} < I_b - I_o + I_c \text{ and } I_o + I_c < I_{J2} < I_o$$

giving somewhat smaller margins. Thus, when $I_f$(attenuated to the level $I_c$) flows into G2, it does not switch. Subsequently, an input current marked T arrives at G2. If A had not arrived at G1, the input current from T would have switched G2, producing an output. Since A did arrive first, the current from T cancels that from G1, so G2 does not switch. Thus, the output current from G2 is present if and only if input A is not present, giving an INVERT function. This function is a timed INVERT because of the need for A to precede T, a typical requirement in latching circuits. Note that the output of G2 is split illustratively into four branches, corresponding to a fanout capability of four.

Figure 3:
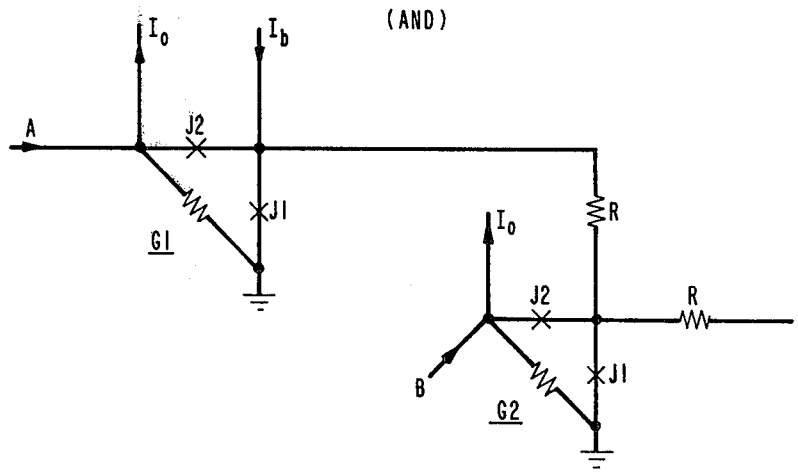
FIG. 3 is a circuit schematic of an AND circuit in accordance with still another embodiment of my invention.

An alternative embodiment of an AND circuit is shown in FIG. 3 where gate G1 provides the bias current for G2, rather than the control current to G2. Inputs A and B may arrive in any order. Current summing takes place in the junction J1 as in FIG. 1, for both G1 and G2. Gate G2 will provide an output only if both A and B are present. Margins are somewhat better than for the single-gate AND.

Figure 4:
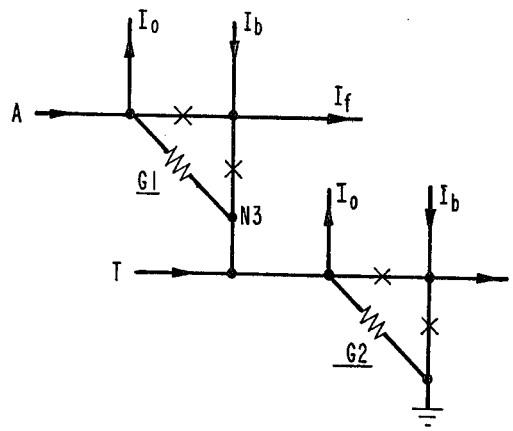
FIG. 4 is a circuit schematic of a timed INVERT circuit in accordance with yet another embodiment of my invention.

Another timed INVERT circuit is shown in FIG. 4 where the bias current $I_b$ flowing out of node N3 of gate G1 (before J1 of G1 is switched to V≠0 by input A) is again utilized, but in this case to supply control current to gate G2. G2 is adapted so that it switches to V≠0 only if timing signal T and $I_b$ from G1 are present essentially simultaneously. When input A is applied, $I_b$ of G1 is diverted to $I_f$ depriving G2 of its control current. Thus, if T were now applied, G2 would not switch and $I_b$ of G2 would continue to flow to ground. On the other hand, if T precedes A, then G2 switches and $I_b$ of G2 flows in its fanout line. Thus, G2 has an output only if A is not present (before T).

Figure 5:
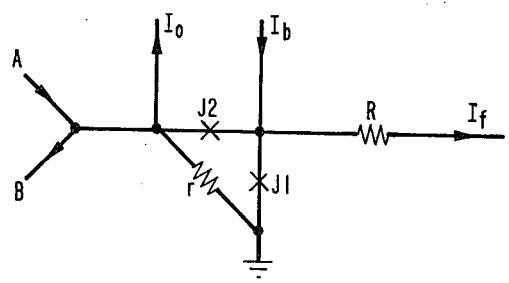
FIG. 5 is a circuit schematic of an exclusive OR circuit in accordance with another embodiment of my invention.

An exclusive OR circuit is shown in FIG. 5. Inputs A and B have opposite directions. Junctions J1 and J2 have the same $I_J$ and $I_o = \frac{1}{2} I_b$, so that J1 and J2 have the same bias level. Then, input A adds to the current in J1 to cause switching, while input B does the same with J2. If A and B arrive simultaneously, they cancel and no switching occurs. To relax the requirement for simultaneity, resistor r could be made smaller than usual to delay the buildup of the control currents in J1 and J2 until both A and B have had time to settle.

IMPROVING CIRCUIT MARGINS

Figure 6:
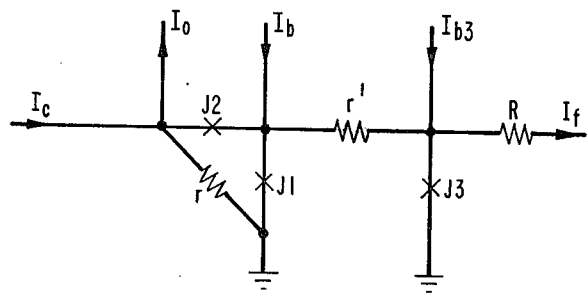
FIG. 6 is a circuit schematic of a modified JAWS gate with additional Josephson junctions added to improve margins.

Adding more junctions can be used to substantially improve margins in some cases. In the circuit shown in FIG. 6, current summing takes place in J1 as in FIG. 1. The switching of J1 diverts $I_b$, $I_o$, and $I_c$ mainly to J3 if r' is made smaller than r. If $I_{J3}$ is set to be less than $I_b + I_{b3} + I_c - I_o$, then J3 will also switch, diverting the combined current $I_b + I_{b3}$ to J2 which also switches. Then $I_b + I_{b3}$ diverts to $I_f$, thus enabling more fanout or larger currents for the same fanout. It also relaxes the upper limits on $I_{J2}$ allowing better margins even for the same level of $I_c$. Note the r', J3, and $I_{b3}$ can also be used in conjunction with a gate of the G1 type shown in FIG. 2 (where the control and fanout currents have opposite signs). Alternatively, in this same circuit, if r is made small with respect to r' and r' << R, then the switching of J1 first diverts current $I_b$ primarily to J2 which will switch if $I_{J2}$ is less than $I_b$. Then $I_b$ diverts through r' to J3 which will switch if $I_{J3}$ is less than $I_b + I_{b3}$. Once again, this gives increased current available for fanout. Further junctions similar to J3 could be added to further increase the current available for fanout.

Figure 7:
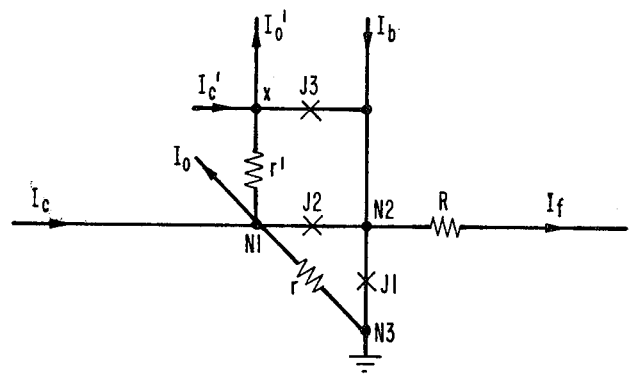
FIG. 7 is a circuit schematic of a modified JAWS gate for improving circuit margins by means of a shunt branch across one of the junctions.

FIG. 7 is another design to improve margins and fanout by means of the series combination of a third junction J3 and a resistor r' << R connected in parallel with either J1 or J2. The latter case is depicted. Electrode means are provided so that auxiliary bias current $I'_o$ and an additional control current $I'_c$ may be applied to node x between r' and J3. Illustratively, summing takes place in J1. Thus, when J1 switches, $I_b$ diverts to J2, switching it and causing $I_b$ to divert to J3. J3 also switches causing $I_b$ to flow into the fanout line. $I_c$ and $I_o$ flow through r to ground whereas $I'_c$ and $I'_o$ flow through r' and r to ground. By splitting the control currents and auxiliary bias currents between $I_c$ and $I'_c$ and $I_o$ and $I'_o$, the margins are improved.

NONLATCHING CIRCUITS

Figure 8:
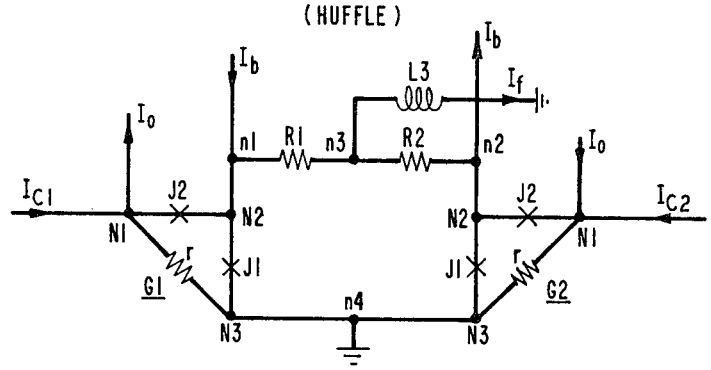
FIG. 8 shows a dual input HUFFLE circuit in which the gates are JAWS.

The basic HUFFLE configuration is shown in FIG. 8 which corresponds to FIG. 2 of the aforementioned application of Fulton and Hebard. The HUFFLE includes first and second Josephson junction gates G1 and G2, electrode means $n_1$ and $n_2$ for appying DC bias current to the gates, control current means $I_{c1}$ and $I_{c2}$ for switching the gates and a passive network coupling the gates to one another. The network is responsive to the switching of states of at least one of the gates to $V \neq 0$ for applying a transient voltage or current (usually of opposite sign) to the other gate effective to reduce its voltage or current below its drop-back level. Illustratively, the DC bias current $I_b$ is applied to node $n_1$ and extracted from $n_2$, and the passive network includes a first resistor $R_1$ connected between $n_1$ and a common third node $n_3$, a second resistor $R_2$ connected between $n_2$ and $n_3$, and inductance means $L_3$ connected between $n_4$ and $n_3$.

Figure 9:
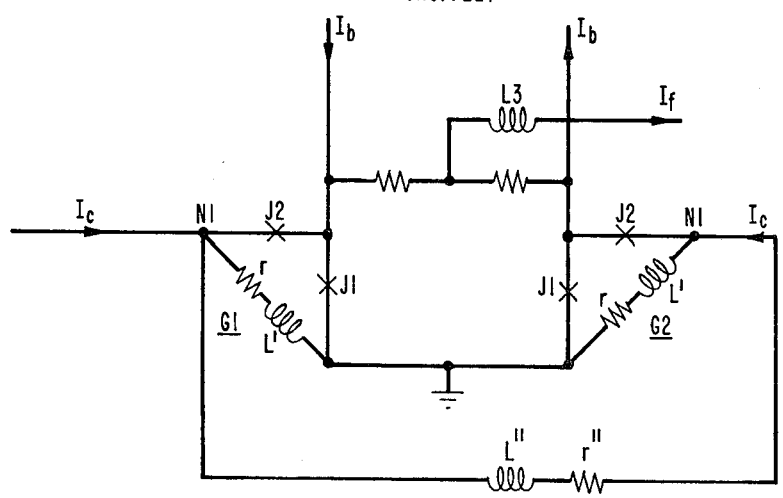
FIG. 9 is a single input HUFFLE circuit in which the gates are JAWS.

Briefly, when gate G1 is switched to $V \neq 0$ by application of a suitable control $I_{c1}$, its bias current is diverted through resistors $R_1$ and $R_2$ which effectively reverse the current in G2 and switch G2 to $V = 0$, and conversely. As noted in the Fulton-Hebard application, gates G1 and G2 can take on a variety of circuit configurations, including the JAWS. Two possible representative approaches are shown in FIGS. 8 and 9. In FIG. 8, node $N_2$ of G1 is connected to $n_1$, nodes $N_3$ of both gates are connected to $n_4$, and node $N_2$ of G2 is connected to $n_2$. There are two independent inputs $I_{c1}$ and $I_{c2}$, one for set and the other reset. In many cases, one would like them to carry the same information. Illustratively, one would choose J1 to do the summing in G1 and G2 so that the HUFFLE output line 20 has positive (negative) current when the inputs have positive (negative) current. In operation, assume that G1 is at $V = 0$ and G2 is at $V \neq 0$ initially. Then, when $I_{c1}$ goes from negative to positive, it flows through J2 and J1 to ground. At the same time, $I_{c2}$ is positive but flows through r of G2 to ground. $I_{c1}$ adds to $I_b$ in J1 causing JAWS G1 to switch to $V \neq 0$ which resets JAWS G2 to $V = 0$. Now, $I_{c1}$ flows through r of G1 to ground and $I_{c2}$ flows through J2 and J1 of G2 to ground. Because $I_{c2}$ is opposite in direction to $I_b$ in G2, G2 remains at $V = 0$ until a negative control current is applied whereupon the reverse sequence of events takes place.

Multiple inputs to G1 and G2 are also possible, at some cost in margins. Margins can be improved, however, by using JAWS gates of the type shown in FIG. 7. As before, auxiliary bias currents $I_o$ can be used to cause summing to occur in J2 rather than J1. Note that G1 and G2 need not be identical gates.

In another variation, one can use a HUFFLE having two JAWS gates with the input control current furnished to only one of the JAWS, and the inputs of the JAWS gate are coupled by a low impedance path. In this circuit, the control current flows to ground through whichever gate is in the $V = 0$ state, i.e., if gate G1 is at $V = 0$ and G2 at $V \neq 0$, the lowest resistance path to ground for $I_c$ is through J2 and then J1 of G1. If positive $I_c$ is applied, G1 switches to $V \neq 0$ and G2 to $V = 0$, and then the lowest resistance path to ground for $I_c$ is through L", r", J2 and J1 of G2. Here it is assumed that r" is small compared to r. At this point in time, positive $I_c$ is opposite in direction to $I_b$ in G2 so that G2 does not switch to $V \neq 0$. Proper switching is enhanced by having the JAWS inductances small compared to L". Conversely, when $I_c$ goes negative, G2 switches $V \neq 0$ and causes G1 to reset to $V = 0$. The control current $I_c$ then returns to G1. This circuit requires only half the input current of the circuit of FIG. 8 for comparable margins.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the JAWS gate can be readily adapted to interferometer configurations in which, for example, J1 of FIG. 1 is replaced by a pair of junctions in parallel in an all-superconducting loop. Memory applications, as described below, are also possible.

MEMORY CIRCUIT

Figure 10:
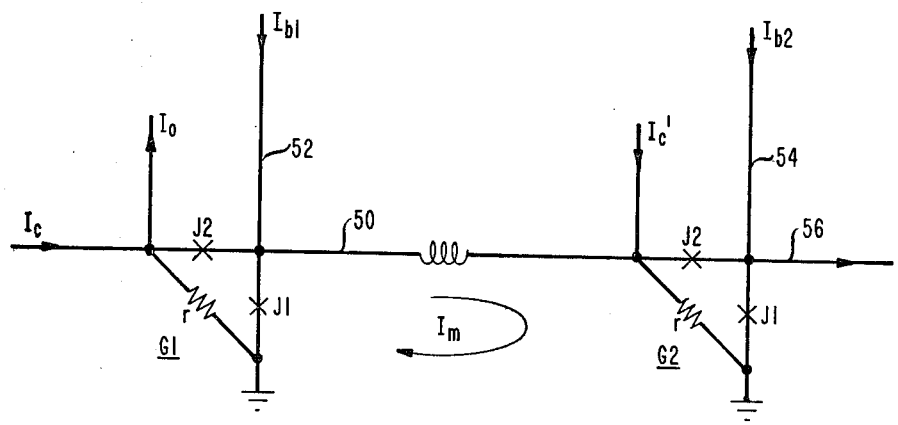
FIG. 10 is a schematic of a memory circuit employing JAWS gates in accordance with another embodiment of my invention.

FIG. 10 shows the JAWS gate used as a memory latch for a latching logic network. A totally superconductive path is connected in parallel with J1 and includes output line 50 for carrying a persistent current $I_m$. This path includes J1 and J2 of G2 when they are at V=0. Gate G1 is biased illustratively by a constant DC current $I_{b1}$ applied to electrode means 52, whereas gate G2 is biased by current $I_{b2}$ which is applied to electrode means 54 and is periodically turned on and off. Suppose G1 is initially at V=0 with $I_{b1}$ flowing to ground through J1. Control current $I_c$ applied to G1 switches it to V≠0 in the way described previously, and $I_{b1}$ diverts to the fanout line 50 where it serves as a control current for G2. The bias current $I_{b2}$ and/or auxiliary control currents $I'_c$ of gate G2 are so set that gate G2 does not switch at this time. Because J2 and J1 of G2 are at V=0, the fanout current line contains no resistance. Therefore, nearly all of the bias current $I_{b1}$ diverts from G1 so that G1 then resets to V=0. Now, a persistent current $I_m$ flows, illustratively, through fanout line 50, J2 and J1 of G2, through ground and J1 of G1 back to line 50. This current is superimposed on $I_{b1}$ flowing through J1 of G1 to ground. Subsequently, $I_{b2}$ and/or $I'_c$ is increased to a level which causes G2 to switch if and only if $I_m$ is present. The output on line 56 of G2 reveals whether G1 has previously switched or not, thus providing the memory function. The switching of G2 also causes $I_m$ in G2 to encounter a finite resistance, which causes $I_m$ to decay, leaving $I_{b1}$ flowing through G1.

We claim:

1. A Josephson junction circuit comprising
   a Josephson junction gate capable of being switched between a low impedance state at V=0 and a high impedance state at V≠0,
   bias electrode means (14) for applying primary bias current to said gate,
   an output line (12) having an impedance connected to said gate,
   control electrode means (10) for applying control current to said gate for switching said gate from V=0 to V≠0 and to divert said primary bias current to said output line, characterized in that said gate comprises
   at least three circuit branches interconnected at three nodes (N1, N2, N3), said first node being connected to said control electrode means and said second node being connected to said output line and to said bias electrode means,
   a first Josephson junction (J1) in the branch between said second and third nodes,
   a second Josephson junction (J2) in the branch between said first and second nodes, and
   a resistor (r) in the branch between said first and third nodes,
   the critical currents of said junctions and said primary bias current ($I_b$) being mutually adapted to initially bias said junctions into their V=0 states and to sequentially switch said junctions to V≠0, when said control current ($I_c$) is applied, thereby causing said primary bias current to flow into said output line and said control current to flow through said resistor and said third node.

2. The circuit of claim 1 further characterized by auxiliary bias electrode means (16) for applying auxiliary bias current ($I_o$) to said first node in a direction opposite to that of said primary bias current, said auxiliary bias current also being mutually adapted along with said primary bias current and said critical currents to cause said junctions to switch sequentially to V≠0, after which said auxiliary bias current and said control current flow through said resistor and said third node.

3. The circuit of claims 1 or 2 wherein said output line has an inductance L, said gate has an inductance L' excluding the inductances of said junctions, and L>L'.

4. The circuit of claims 1 or 2 wherein said output line has a resistance R> r.

5. The circuit of claim 2 wherein said primary bias current and said control current are applied to said gate in the same direction, said control current has a low level $I_{co}$ and a relatively higher level $I_{co}+\Delta I_c$, and said first and second junctions have critical currents $I_{J1}$ and $I_{J2}$, respectively, which satisfy the following inequalities:

$$(I_b-I_o+I_{co})<I_{J1}<((I_b-I_o)+I_{co}+\Delta I_c I_o-I_{co}<I_{J2}<I_b$$

so that the current in said output line flows in the same direction as said control current.

6. The circuit of claim 2 wherein said primary bias current and said control current are applied to said gate in opposite directions, said control current has a low level $I_{co}$ and a relatively higher level $(I_{co}+\Delta I_c)$, and said first and second junctions have critical currents $I_{J1}$ and $I_{J2}$, respectively, which satisfy the following inequalities:

$$(I_b-I_o-I_{co})<I_{J1}<I_b I_{co}+I_o<I_{J2}<I_{co}+\Delta I_c+I_o$$

so that the current in said output line flows in a direction opposite to that of said control current.

7. An INVERT circuit (FIG. 2) comprising
   a second circuit (G2) according to claim 2 wherein said primary bias current and said control current are applied to said gate in the same direction, said control current has a low level $I_{co}$ and a relatively higher level $I_{co}+\Delta I_c$, and said first and second junctions have critical currents $I_{J1}$ and $I_{J2}$, respectively, which satisfy the following inequalities:

$$(I_b-I_o+I_{co})<I_{J1}<((I_b-I_o)+I_{co}+\Delta I_c I_o-I_{co}<I_{J2}<I_b$$

so that the current in said output line of said second circuit flows in the same direction as said control current,
   a first circuit (G1) according to claim 2 wherein said primary bias current and said control current are applied to said gate in opposite directions, said control current has a low level $I_{co}$ and a relatively higher level $(I_{co}+\Delta I_c)$, and said first and second juntions have critical currents $I_{J1}$ and $I_{J2}$, respectively, which satisfy the following inequalities:

$$(I_b-I_o-I_{co})<I_{J1}<I_b I_{co}+I_o<I_{J2}<I_{co}+\Delta I_c+I_o$$

so that the current in said output line of said first circuit flows in a direction opposite to that of said control current,
   said output line of said first circuit (G1) being connected to said control electrode means of said second circuit (G2).

8. An AND circuit (FIG. 3) comprising a pair of circuits according to claim 4 wherein the output line of one of said circuits is connected to the primary bias electrode means of the other of said circuits so as to supply said primary bias current to said other circuit.

9. An INVERT circuit (FIG. 4) comprising a pair of circuits according to claim 4 wherein said third node of one of said circuits is connected to said control electrode means of said other circuit.

10. A circuit (FIG. 7) according to claims 1 or 2 further including
a third Josephson junction (J3),
a resistor (r') connected in series with said third junction at a node (x),
the series combination of said third junction and said second resistor being connected in parallel with one of said first or second junctions, and
electrode means for applying control current ($I'_c$) to said node (x).

11. The circuit of claim 10 including electrode means for also applying another auxiliary bias current ($I'_o$) to said node (x).

12. A superconductive HUFFLE circuit (FIGS. 8, 9) comprising
first and second Josephson junction gates (G1, G2) each having $V=0$ and $V \neq 0$ states, a critical current which when exceeded causes the gate to switch from $V=0$ to $V \neq 0$, and a drop-back level below which the gate switches from $V \neq 0$ to $V=0$,
electrode means ($n_1$, $n_2$) for applying DC bias current ($I_b$) to said gates,
control electrode means ($I_c$) for selectively switching said gates between their $V=0$ and $V \neq 0$ states, and
a passive network ($R_1$, $R_2$, $L_3$) coupling said gates to one another and responsive to the switching of states of at least one of said gates to $V \neq 0$ for applying a transient voltage or current to the other of said gates effective to reduce its voltage or current below the drop-back level thereof, characterized in that
each of said gates comprises a superconductive circuit according to claims 1, 2, 5, or 6.

13. The circuit of claim 12 wherein
said DC bias electrode means includes a first node ($n_1$) for applying bias current to said gates and a second node ($n_2$) for extracting bias current from said gates,
said passive network comprises
a first resistor ($R_1$) connected between said first node ($n_1$) and a common third node ($n_3$)
a second resistor ($R_2$) connected between said second node ($n_2$) and said common node ($n_3$), and
inductance means ($L_3$) connected between a fourth node ($n_4$) and said common node ($n_3$), further characterized in that
said second node ($N_2$) of one of said gates (G1) is connected to said first node ($n_1$) of said HUFFLE circuit, said third nodes ($N_3$) of both of said gates are connected to said fourth node ($n_4$) of said HUFFLE circuit, and
said second node ($N_2$) of said other gate (G2) is connected to said second node ($n_2$) of said HUFFLE circuit, so that said output lines of said gates supply current through said resistors ($R_1$, $R_2$) to said inductance means ($L_3$).

14. The circuit (FIG. 9) of claim 13 further including a low impedance circuit path connecting said control electrode means of said gates to one another.

15. A memory circuit (FIG. 10) comprising
a circuit according to claim 1,
a totally superconductive path connected in parallel with said first junction and including said fanout line for carrying a persistent current, and
means for sensing the presence or absence of said persistent current.

16. A Josephson junction circuit comprising
a Josephson junction gate capable of being switched between a low impedance state at $V=0$ and a high impedance state at $V \neq 0$,
bias electrode means (14) for applying primary bias current to said gate,
an output line (12) connected to said gate, said output line having an impedance,
control electrode means (10) for applying control current to said gate for switching said gate from $V=0$ to $V \neq 0$ and to divert said primary bias current to said output line, characterized in that said gate comprises
at least three circuit branches interconnected at three nodes (N1, N2, N3) forming a loop circuit, said first node being connected to said control electrode means and said second node being connected to said output line, and said bias electrode means being adapted to inject said primary bias current into said loop circuit,
a first Josephson junction (J1) in the branch between said second and third nodes,
a second Josephson junction (J2) in the branch between said first and second nodes, and
a resistor (r) in the branch between said first and third nodes,
the critical currents of said junctions and said primary bias current ($I_b$) being mutually adapted to initially bias said junctions into their $V=0$ states and to sequentially switch said junctions to $V \neq 0$, when said control current ($I_c$) is applied, thereby causing said primary bias current to flow into said output line and said control current to flow through said resistor and said third node.

17. The circuit of claim 16 further characterized in that said bias electrode means is adapted to inject said primary bias current into the circuit branch which is connected between said first and second nodes.

* * * * *

UNITED STATES PATENT AND TRADEMARK OFFICE
CERTIFICATE OF CORRECTION

PATENT NO. : 4,275,314
DATED : June 23, 1981
INVENTOR(S) : Theodore A. Fulton

It is certified that error appears in the above—identified patent and that said Letters Patent is hereby corrected as shown below:

In Detailed Description, column 3, line 19, "as" should read --is--. Column 10, line 5, "L > L'" should read --L >> L'--; column 10, line 7, "R > r" should read --R >> r --; in column 10, line 16, that part of the equation reading:

$$"I_o - I_{co} < I_J2 < I_b"$$ should read $$-- I_o - I_{co} < I_{J2} < I_b --.$$

In claim 7, column 10, line 54, "juntions" should read --junctions--.

Signed and Sealed this

Seventeenth Day of August 1982

[SEAL]

Attest:

Attesting Officer

GERALD J. MOSSINGHOFF
Commissioner of Patents and Trademarks